US006181149B1

(12) United States Patent
Godfrey et al.

(10) Patent No.: US 6,181,149 B1
(45) Date of Patent: *Jan. 30, 2001

(54) GRID ARRAY PACKAGE TEST CONTACTOR

(75) Inventors: Mark K. Godfrey, Oakdale; Jessie G. Crane, South St. Paul; Paul Zadworniak, White Bear Lake, all of MN (US)

(73) Assignee: Delaware Capital Formation, Inc., Wilmington, DE (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/715,838

(22) Filed: Sep. 26, 1996

(51) Int. Cl.⁷ .................................................. G01R 15/12

(52) U.S. Cl. ........................................... 324/761; 324/754

(58) Field of Search ..................................... 324/754, 755, 324/765, 761, 762; 439/66–70, 71; 438/14, 17

(56) References Cited

U.S. PATENT DOCUMENTS

| 3,702,439 | 11/1972 | McGahey et al. | 324/158 |
|---|---|---|---|
| 4,068,170 | 1/1978 | Chayka et al. | 324/72.5 |
| 4,267,506 | * 5/1981 | Shiell | 324/761 |

(List continued on next page.)

FOREIGN PATENT DOCUMENTS

| 195 15 154 | 3/1996 | (DE) . | |
| 0420690 | 4/1991 | (EP) . | |
| 0582537 | 2/1994 | (EP) | H04L/29/06 |
| 2274212 | 7/1994 | (GB) . | |

OTHER PUBLICATIONS

"Manual Test Probing of Very Small Targets on the Top and Bottom of a Module Simultaneously", *Research Disclosure*, 2244, No. 329, Emsworth, GB, p. 656 (1991).
Bove, R., "High Performance contactor", *IBM Technical Disclosure Bulletin*, vol. 18, No. 9, p. 2883 (Feb. 1976).
Byrnes, H.P., et al., "Pad Deformation Contactor", *IBM Technical Disclosure Bulletin*, vol. 21, No. 11, pp. 4511–4512 (Apr. 1979).

(List continued on next page.)

*Primary Examiner*—Vinh P. Nguyen
(74) *Attorney, Agent, or Firm*—Christie, Parker & Hale, LLP

(57) ABSTRACT

A contactor apparatus used in automatic testing in a manufacturing line includes a site for receiving an electrical device with an array of input/output elements on a surface of the electrical device package. The contactor is capable of forming electrical connections with each of the elements in the array. The contactor has a guide plate including plurality of contact elements. Each contact element has a first end and a second end. The contact elements are positioned in an array which corresponds to the array of input/output elements of the electrical device. The guide plate is attached to a printed circuit having a plurality of pads. The pads are also situated in an array. The printed circuit is an interface to test electronics located near the printed circuit. An anisotropic compliant conductive interposer is positioned between the contact elements of the guide plate and pads of the printed circuit. One end of a contact element contacts the anisotropic compliant conductive interposer in response to the other end of the contact element being contacted by the input/output element. The anisotropic compliant conductive interposer conducts electric signals along a path between the one end of the contact element and a pad on the printed circuit below the contact element providing contact force at the contact elements using the input/output elements on the electrical device. The anisotropic compliant conductive interposer has an elastomeric base which counteracts the force from the contact element.

19 Claims, 11 Drawing Sheets

U.S. PATENT DOCUMENTS

| | | | |
|---|---|---|---|
| 4,419,626 | 12/1983 | Cedrone et al. | 324/158 |
| 4,443,756 * | 4/1984 | Lightbody et al. | 324/761 |
| 4,574,235 | 3/1986 | Kelly et al. | 324/158 F |
| 4,618,820 * | 10/1986 | Salvagno et al. | 324/761 |
| 4,686,468 | 8/1987 | Lee et al. | 324/158 F |
| 4,747,784 | 5/1988 | Cedrone | 439/71 |
| 4,793,814 * | 12/1988 | Zifcak et al. | 439/66 |
| 4,835,464 | 5/1989 | Slye et al. | 324/158 F |
| 4,904,935 * | 2/1990 | Calma et al. | 324/754 |
| 5,057,904 | 10/1991 | Nagato et al. | 357/74 |
| 5,127,837 | 7/1992 | Shah et al. | 439/71 |
| 5,134,364 * | 7/1992 | Karpman et al. | 324/72.5 |
| 5,136,586 | 8/1992 | Greenblatt | 370/110.4 |
| 5,156,649 | 10/1992 | Compton et al. | 439/68 |
| 5,171,290 | 12/1992 | Olla et al. | 439/71 |
| 5,277,594 | 1/1994 | Matsuoka et al. | 439/172 |
| 5,307,012 | 4/1994 | Bhattacharyya et al. | 324/158 |
| 5,452,289 | 9/1995 | Sharma et al. | 370/32.1 |
| 5,479,110 | 12/1995 | Crane et al. | 324/757 |
| 5,500,605 | 3/1996 | Chang | 324/758 |
| 5,557,212 | 9/1996 | Isaac et al. | 324/755 |
| 5,742,171 | 4/1998 | Matsunaga et al. | 324/755 |

OTHER PUBLICATIONS

D A Johnson, et al., "Test Socket Performance Handbook", Published by Johnstech International Corporation, 42 pgs, (Oct. 1993).

Johnson, D.A., et al., "Test Socket Performance Handbook", Jonstech International, 1st Edition, 5–36, (1993) (Unavailable Month).

* cited by examiner

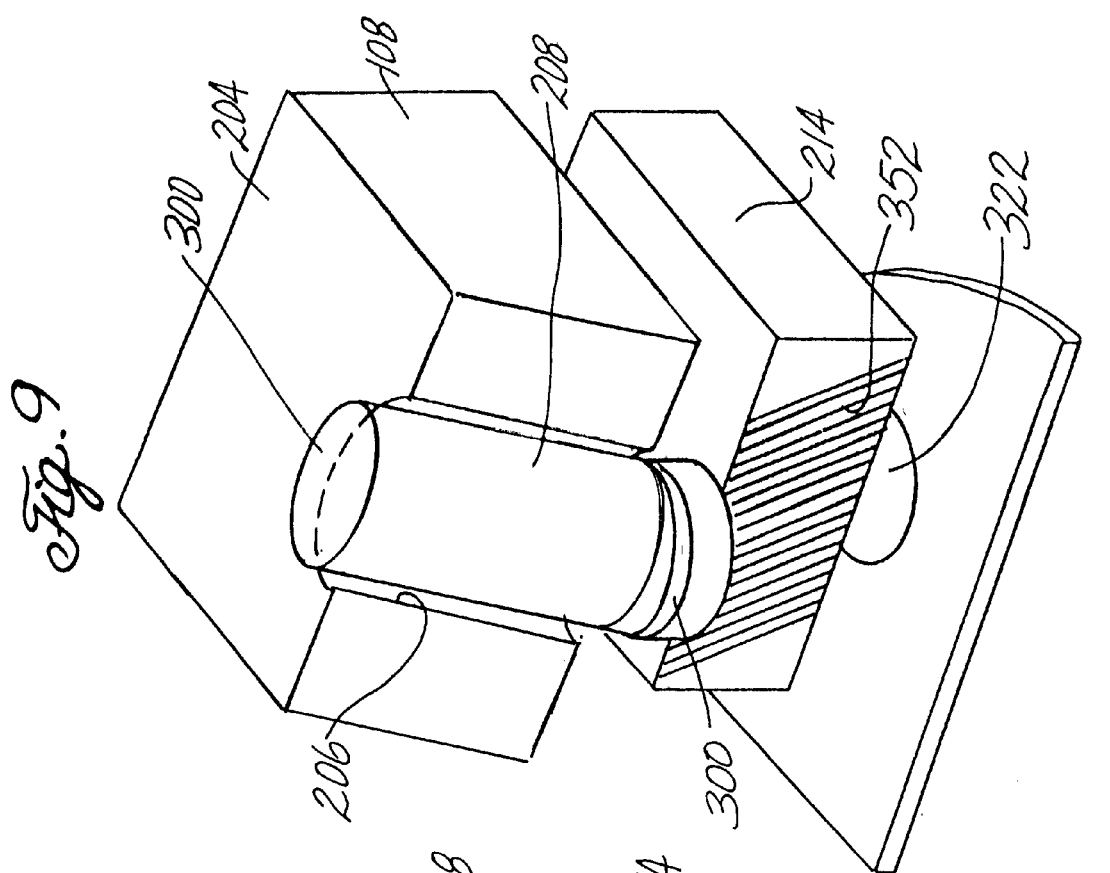
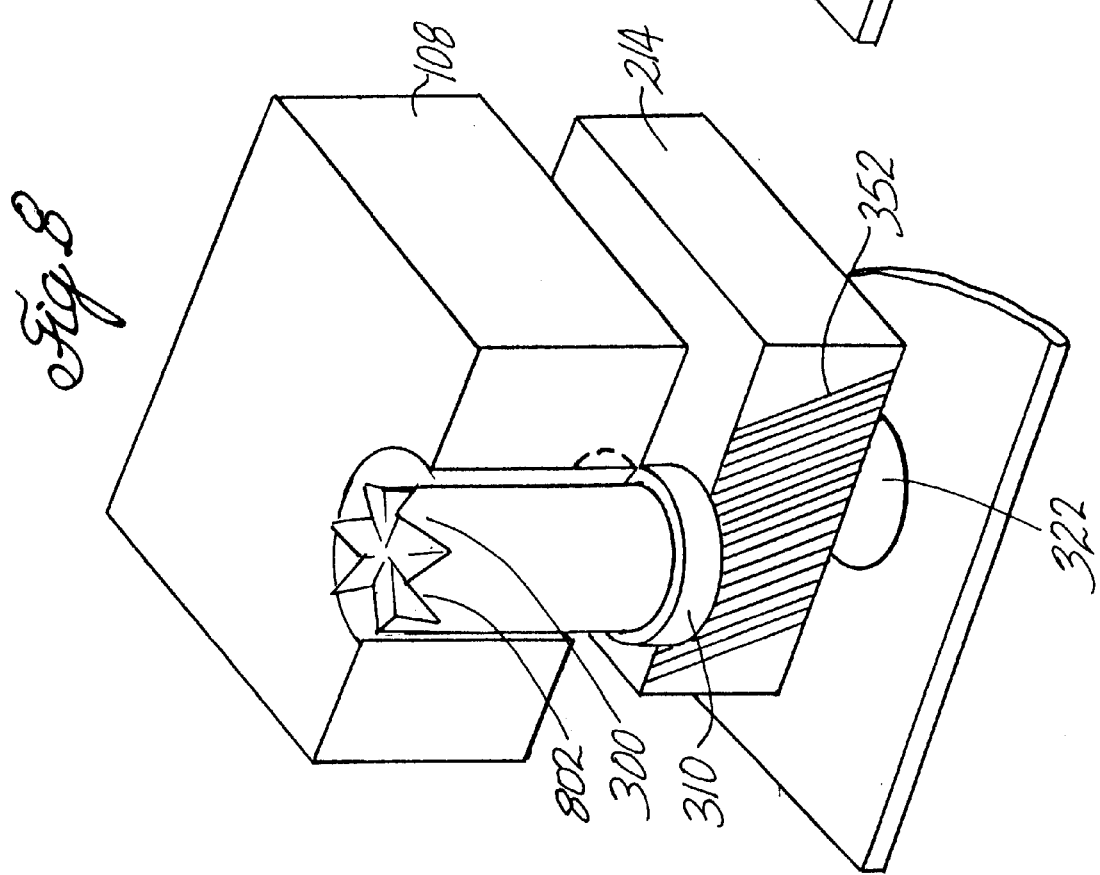

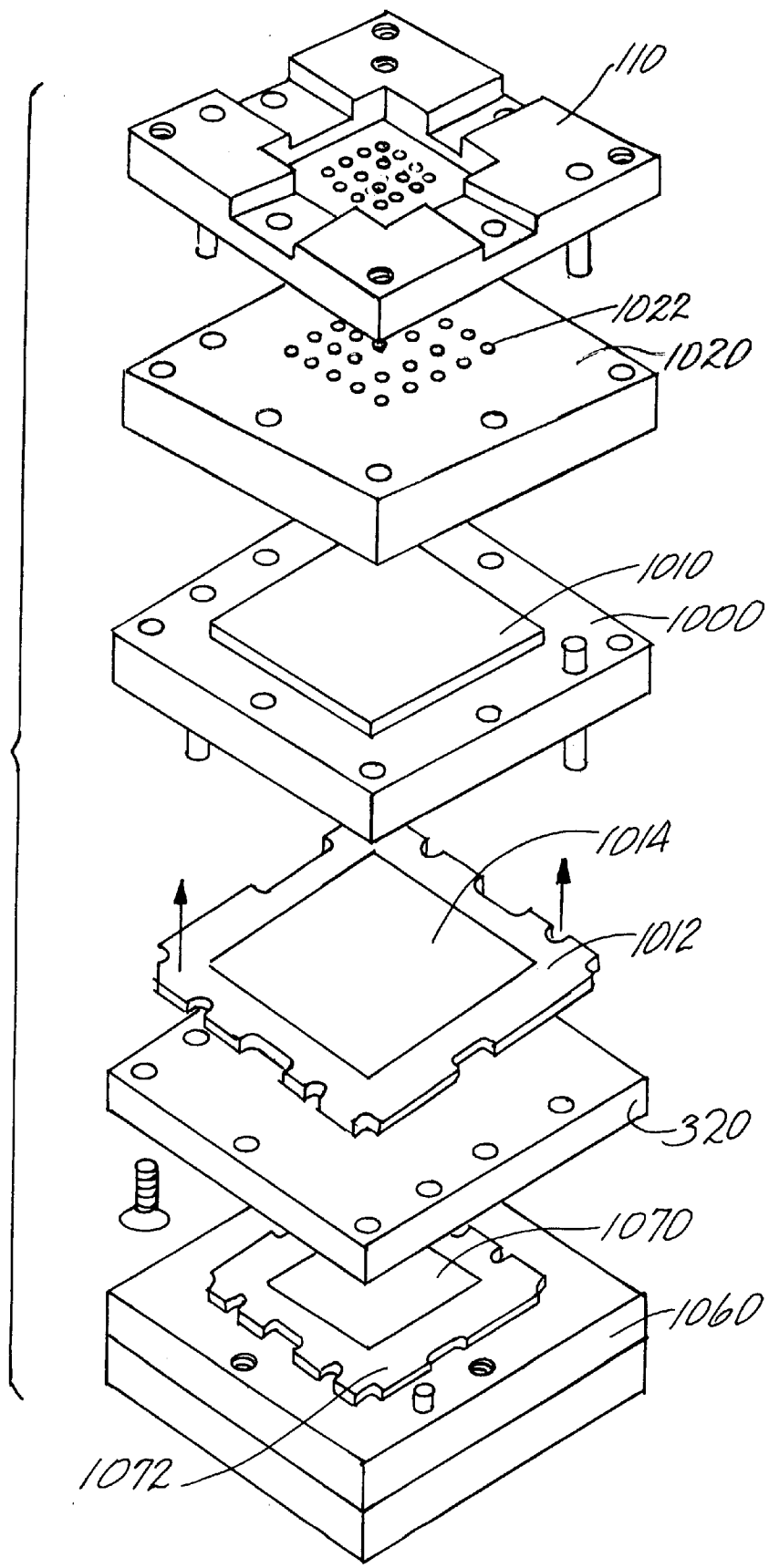

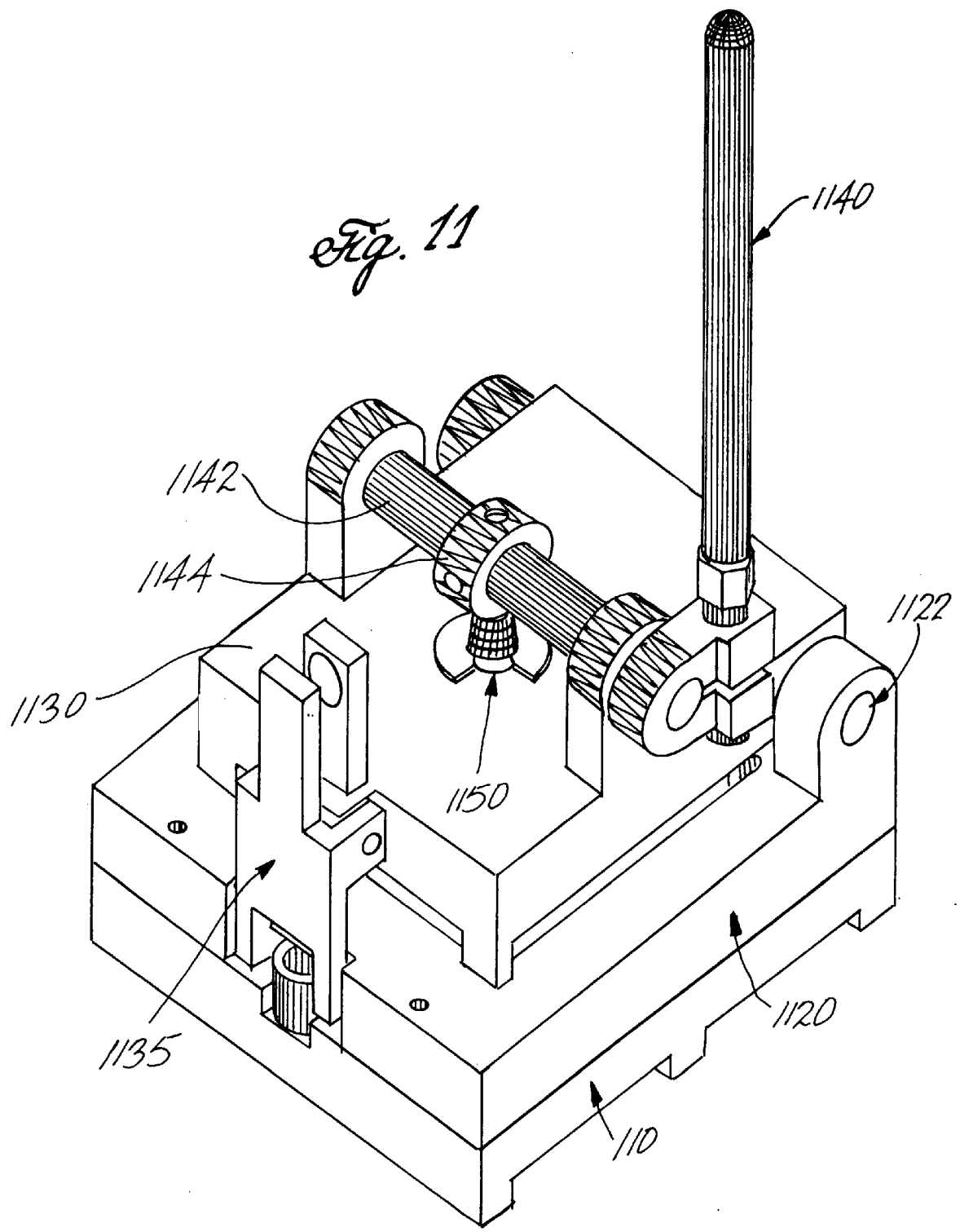

GRID ARRAY PACKAGE TEST CONTACTOR

FIELD OF THE INVENTION

The present invention relates to a method and apparatus for providing electrical contacts and more specifically to making electrical contacts between an electronic test apparatus and an electrical component in a grid array package.

BACKGROUND OF THE INVENTION

As more and more capability is being designed into electronic components, such as memory modules and microprocessors, there are an increasing number of leads or input/output elements being placed onto electronics packages. In the past, peripherally leaded packages provided an adequate number of leads or input/output elements. Peripherally leaded packages have leads or input/output elements along the edges of the electronic component. In many applications, such packages provide an adequate number of input/output elements. In the past few years, however, there are electronic components that require more input/output elements and require packages with more densely packed leads. Grid array packaging with input/output elements placed on the surface of the components have been used to provide additional leads. There are several types of grid arrays. Ball grid arrays and chip scale packages have hemispherical solder balls as input/output elements. Land grid arrays have flat gold plated pads as input/output elements. Pin grid arrays have gold plated pins as input/output elements.

In the past, several apparatus have been used to make electrical testing connections to grid array and other semiconductor packages. Previous test contactors have had severe limitations for high performance devices and for reliable operation when used with high volume, automated device handling equipment. Many of the problems result in poor electrical performance. Typically, this is due to long electrical path lengths within the contactor. Long electrical path lengths exhibit undesirable impedance effects which interfere with the integrity of the electrical tests being performed on the device under test. Undesirable impedance effects include long paths of uncontrolled impedance. Such uncontrolled impedance paths distort high frequency signal integrity and allow crosstalk between physically adjacent paths. Other undesirable impedance effects include parasitic inductance, capacitance, and resistance. Parasitic path inductance interferes with device power and ground sourcing by inducing voltage spikes during instantaneous electrical current changes. Parasitic capacitance presents undesirable electrical loading of device and test electronics signal sources. Parasitic resistance causes voltage errors when significant current must flow through the resistive path. This is only a partial list of undesirable impedance effects which occur with long electrical paths in test contactors.

Previous test contactors often performed poorly in high volume test environments which employ automated device handling equipment. Contactor fragility often results in contactor damage when a handling equipment error presents a device to a contactor incorrectly. Contactors often wear rapidly during high volume use resulting in wear damage to alignment features and contact surfaces. Contactors may also be too susceptible to contamination from normal production environment debris such as package resin dust and package lead solder-plating.

Spring contact pins are one type of contact used to make test contactors. Inside the body carrying the contact pin is a spring. The spring interacts with long and fragile leads. Therefore, not only is electrical performance poor because of the undesirable impedance effects due to the long leads, but the life of the spring contact pin is limited due to the fragile leads.

Wadded wire contacts are another option for contacting input/output elements in a grid array. Wadded wire contacts are made of an electrically conductive spring wire material that resemble steel wool. The wadded wire contacts are small steel wool like balls or columns that are brought into contact with the input/output elements of a grid array. The problem with wadded wire contacts is that many times the small steel wool like balls take compression set early in their operating life. Each wadded wire contact in an array of wadded wire contacts can be good at manufacture or installation in the contactor but may develop a set after being compressed a few times resulting in loss of spring characteristics. The wadded wire contact arrays must undergo extensive testing before they are used. In addition, wadded wire contacts cannot be spaced closely enough together to contact the individual input/output elements on a very high density, grid array typical of chip-scale BGA packages.

Rigid contacts with an elastomer support have also been used to contact input output/elements in a grid array. A common elastomer supports an array of rigid contacts. This type of contactor has numerous problems. For example, the constant compression and decompression of the elastomer results in a continuous scrubbing of the user interface board. This causes premature board failure. In addition, the common elastomer has a different coefficient of thermal expansion than does the electronic device under test. The differences in coefficient of linear expansion values make it difficult to hold registration between the input/output elements and the device under test over a broad range of temperature. Yet another problem is poor compliancy. This system tends to require very high compression forces to accommodate non-coplanarities in electronic devices under test.

There is a real need for a contactor which can contact grid arrays that does not have the electrical performance problems of an undesirable impedance effects associated with long leads. There is also need for a contactor that has the robustness necessary for an automated test environment. There is further need for a contactor that does not depend on temperature. There is also a need for a contactor having enhanced compliance.

SUMMARY OF THE INVENTION

A contactor apparatus used in automatic testing in a manufacturing line includes a site for receiving an electrical device with an array of input/output elements on a surface of the electrical device package. The contactor is capable of forming electrical connections with each of the elements in the array. The contactor has a guide plate including plurality of contact elements. Each contact element has a first end and a second end. The contact elements are positioned in an array which corresponds to the array of input/output elements of the electrical device. The guide plate is attached to a printed circuit having a plurality of pads. The printed circuit is external to the contactor. The pads are also situated in an array. The printed circuit is an interface to test electronics located near the printed circuit.

An anisotropic compliant conductive interposer is positioned between the contact elements of the guide plate and pads of the printed circuit. One end of a contact element contacts the anisotropic compliant conductive interposer in response to the other end of the contact element being contacted by the input/output element. The anisotropic compliant conductive interposer conducts electric signals along a path between the one end of the contact element and a pad on the printed circuit below the contact element providing contact force at the contact elements using the input/output elements on the electrical device. The anisotropic compliant conductive interposer has an elastomeric base which counteracts the force from the contact element. The end result is an electrical path from the input/output element of the electrical device to a pad on the printed circuit. The electrical path includes the contact element and a portion of the anisotropic compliant conductive interposer. The path is very short so undesirable impedance effects due to the electrical path are minimized. In addition, one end of the contact elements can be shaped to provide the best possible contact to the input/output elements on the electrical device. The other end of the contact element can be shaped to allow for a good contact to the anisotropic compliant conductive interposer and shaped so that the life of the anisotropic compliant conductive interposer will be maximized. Advantageously, the guide plate and contact elements isolate the anisotropic compliant conductive interposer from contaminants that rub or are scraped off the input/output elements of the electrical device.

BRIEF DESCRIPTION OF THE DRAWINGS

FIG. 8 is a cutaway perspective view of another contact element.

FIG. 9 is a perspective cutaway view of an angled opening and contact element in a guide plate.

FIG. 10 is an exploded perspective view of an interface board and contactor with external circuitry modules.

FIG. 11 is a perspective view of a manual contactor.

DESCRIPTION OF THE PREFERRED EMBODIMENT

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
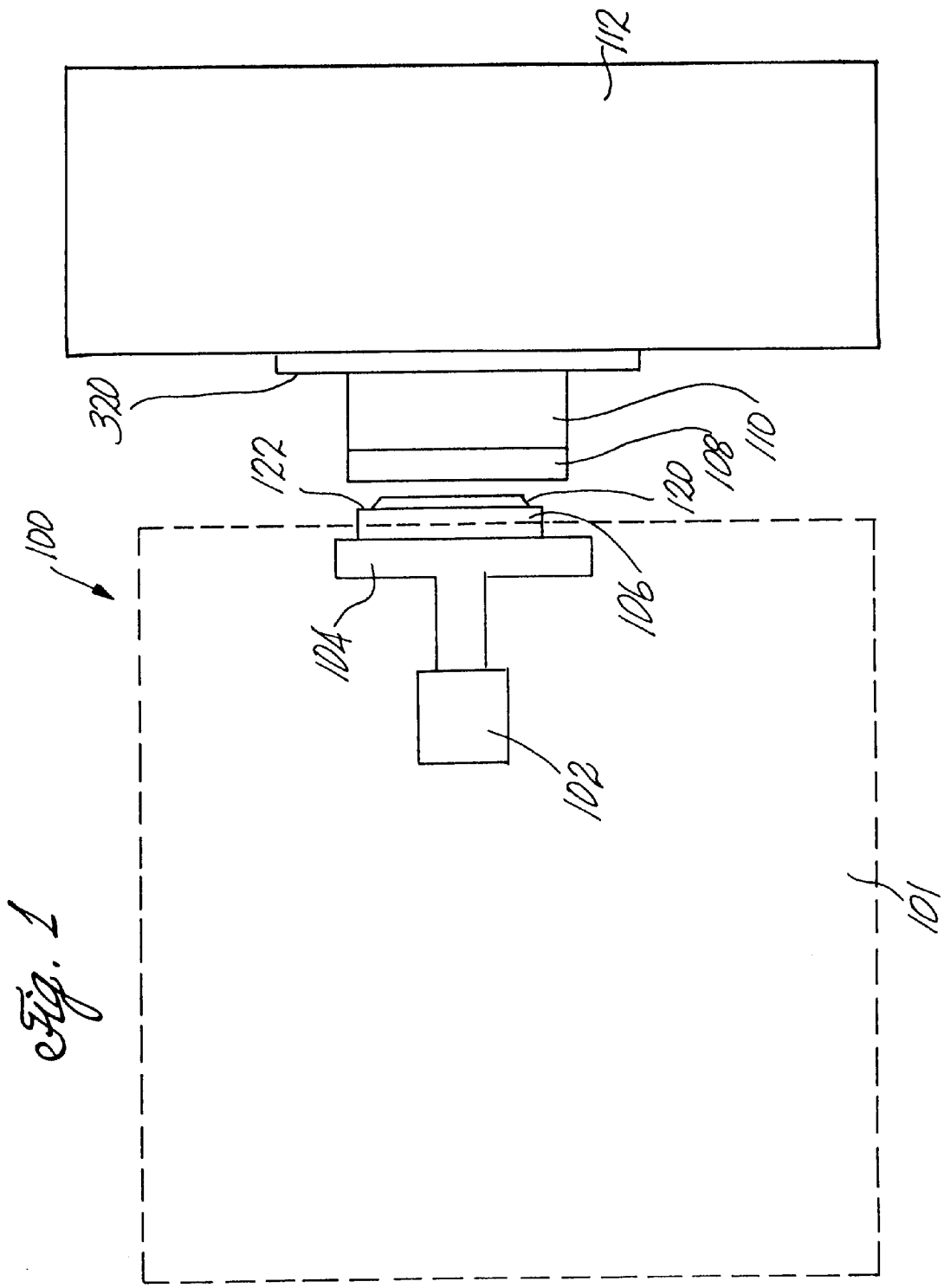
FIG. 1 is a schematic diagram of a testing apparatus.

FIG. 1 is a schematic diagram of the testing apparatus. The testing apparatus 100 includes an automated test handler 101. The automated test handler includes an actuator 102, a plunger 104, and a nest 106. The testing apparatus also includes an apparatus for making electrical contact and performing electrical tests on an electrical component or device under test. The testing apparatus includes a contactor 110 having a a guide plate 108, an interface board 320 and automatic test equipment or test electronics 112. The nest 106 holds an electrical component under test. The electrical component is not shown in FIG. 1. The plunger 104 typically holds the electrical component within the nest via vacuum pickup. The nest may include beveled surfaces or other features, such as bevel 120, which is used to roughly align the nest with the guide plate 108. The nest also includes some hard stops 122 which abut the edge of the guide plate and prevent the nest from traveling further into the guide plate 108. When the nest 106 is holding the electrical component to be tested, the plunger is moved by actuator 102 so that the electrical component is moved out of the automated test handling 101 and toward the guide plate 108. The guide plate provides coarse alignment as the nest 106 enters the guide plate 108. The guide plate 108 may also provide precise alignment when a land grid array electronics package is under test. The guide plate sits atop a contactor 110 which includes electrical contacts and electrical paths to the electronics 112 for testing the electrical component. The electronics for testing the component are also called automatic test equipment.

Figure 2:
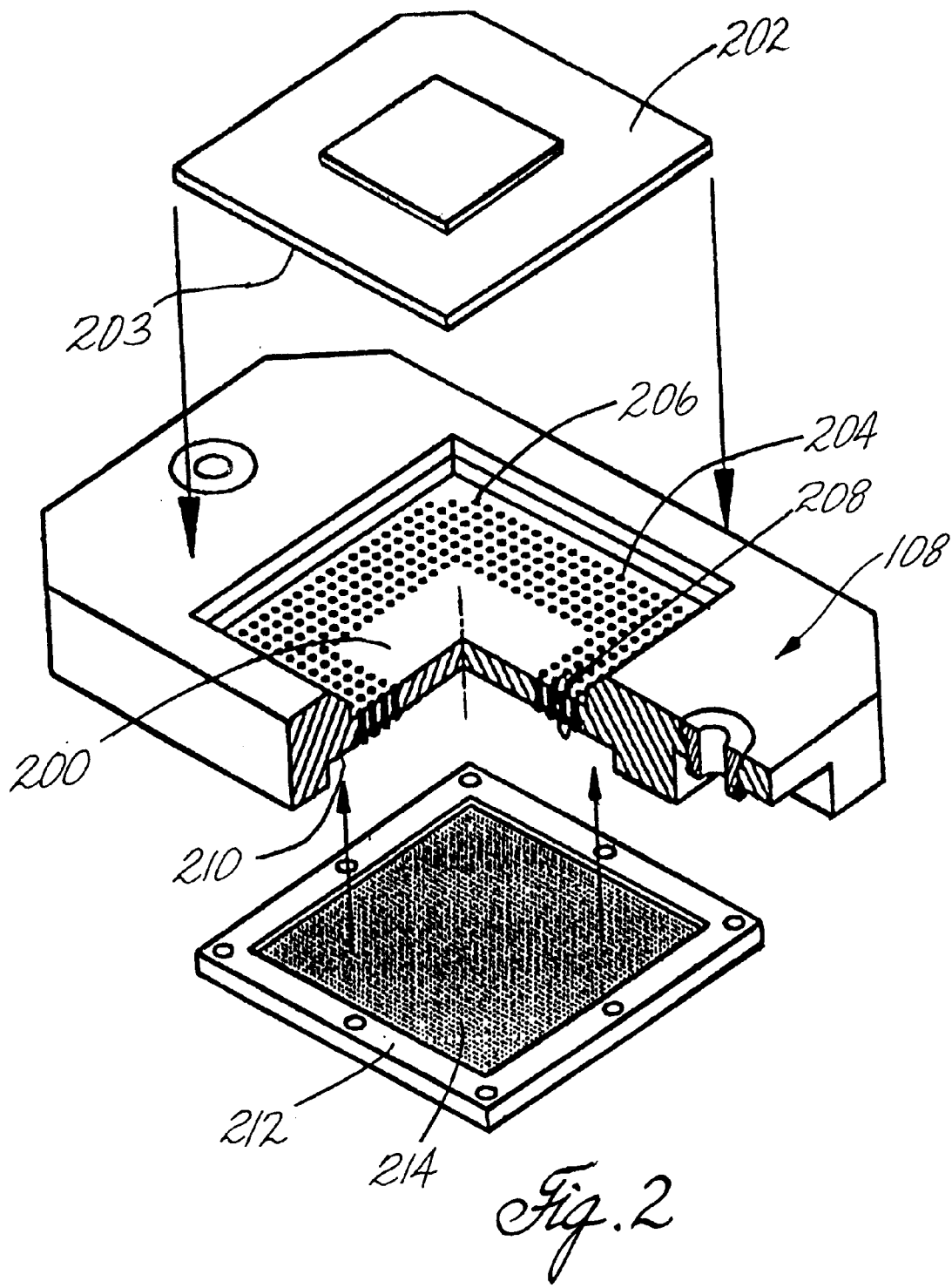
FIG. 2 is a exploded isometric drawing of a contactor.

FIG. 2 shows an exploded isometric drawing of a contactor. The actuator 102, plunger 104 and nest 106 have not been shown in FIG. 2 so that the guide plate 108 and contactor 110 could be described in more detail. The contactor 110 includes a site 200 for receiving the electrical component 202 under test. The electrical component 202 under test has a number of input/output elements 203 positioned on one surface of the electrical component. The site includes a surface 204. In the surface are a plurality of openings 206. The openings are positioned in an array which corresponds to the array of the electrical component 202 under test. Each opening includes a contact element 208. This is best seen at the cutaway portion of the guide plate 108. Opposite the surface of the site 200 is a cavity 210 for receiving a frame 212. The cavity 210 is shaped to receive the frame 212. Attached to the frame 212 is a sheet of an anisotropic compliant conductive interposer 214. The frame 212 provides a standoff for the anisotropic compliant conductive interposer 214. In other words, the frame 212 holds the anisotropic compliant conductive interposer away from the surface of the cavity 210. The anisotropic frame prevents the anisotropic interposer from being compressed by the guide plate 108.

The device or electrical component 202 is packaged in a grid array type semiconductor package. The device 202 has input/output elements 203 arranged in an array over one of the larger surfaces of the package body. The particular package shown is a ball grid array package. There are other grid array type packages which include pin grid arrays, land grid arrays, and chip-scale grid arrays. The device 202 is a typical example of one of these types of packages. It should be noted that the devices come in various dimensions and that the input/output elements may be arranged in different types of arrays.

Figure 3:
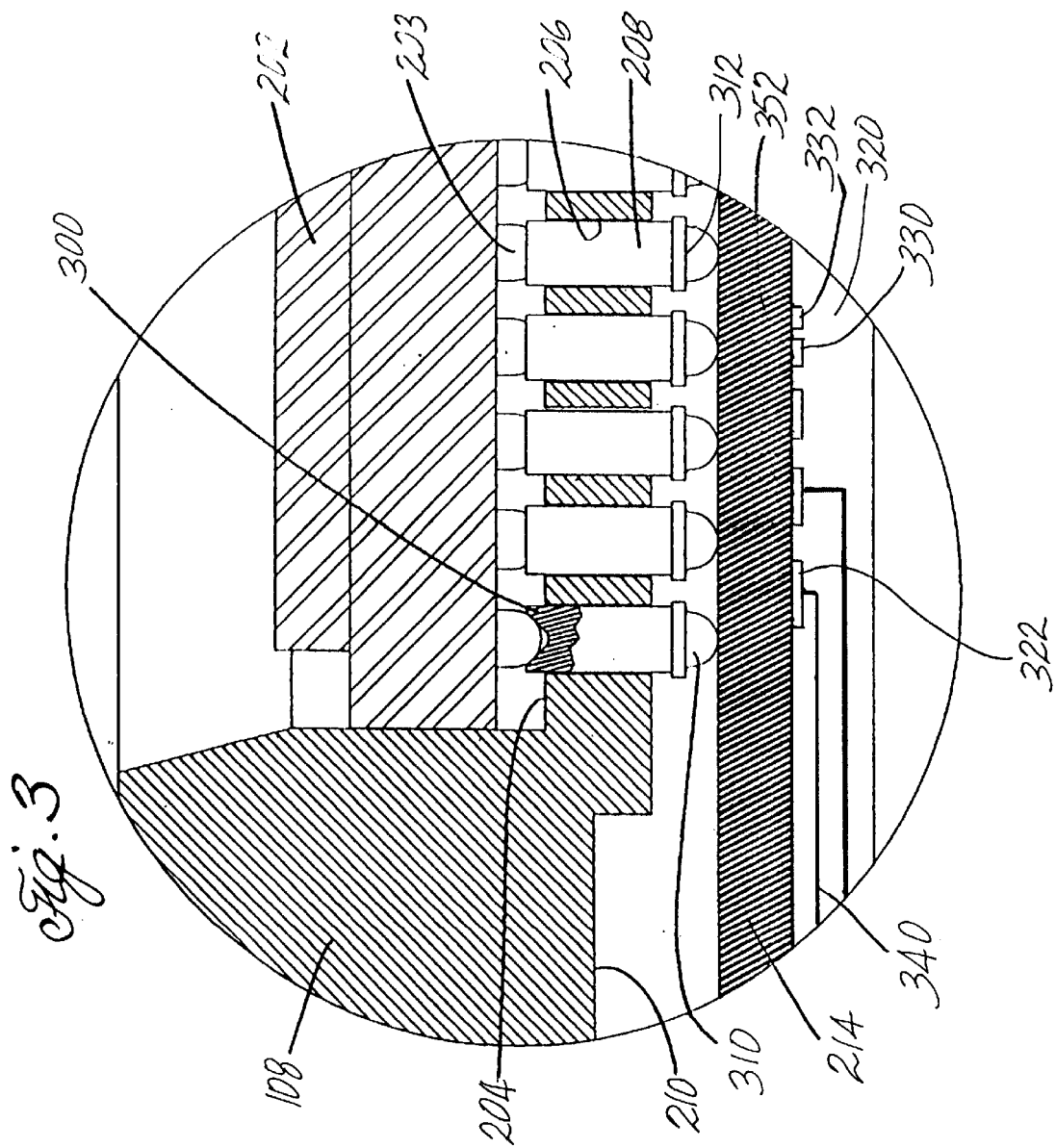
FIG. 3 is a cross section view of an assembled contactor as shown in FIG. 2.

FIG. 3 shows a cross sectional view of the electrical component 202 positioned within the site 200 of the guide plate 108. The guide plate 108 is attached or abuts a user interface board 320. The input/output elements 203 are shown in contact with the contact elements 208 of the guide plate 108. The contact elements 208 typically have one end 300 which is designed make electrical contact with the input/output elements 203 and another end 310 designed to contact the anisotropic compliant conductive interposer material 214. In FIG. 3, for example, the end 300 of contact 208 has a concave shape for receiving the ball or hemispherical input/output element of the electrical device under test 202. The end 310 which contacts the anisotropic compliant conductive interposer 214 has a hemispherical shape. Advantageously, the concave shape or cup shape of the end 300 of the contact element 208 provides a self centering feature. If close, the taper associated with the cup or concave surface guides the ball into full engagement with the contact element 208. In addition, the end 310 of the contact element 208 is designed so that it will not prematurely wear out the anisotropic interposer 214. A stop ring 312 is also positioned near the end 310 of the contact element 208. The stop ring 312 retains the contact element 208 in the guide plate 108.

The interface board 320 which has a plurality of pads 322. In most instances there is one pad 322 for each of the contact element 208. It should be noted that the user interface board 320 may have more than one pad for each contact element 208 in the contactor. To illustrate this, at one particular site on the user interface board 320 has two pads to which the contact element will make an electrical connection in response to the electrical component contacting one end of the contact element 208. On this particular interface board 320, the two pads are grouped into two types, namely a force-trace pad 330 and a sense-trace pad 332. At this point, the discussion will not address the two different types of pads on this particular interface board. The pads 322 provide an electrical path to the test electronics 112 by way of electrical signal paths 340 in the user interface board 320.

The anisotropic compliant conductive interposer material 214 is comprised of an elastomeric sheet 350 that includes a plurality of conductors 352. FIG. 3 shows a cross-sectional view of the particular anisotropic compliant conductive interposer material used in this invention. The particular anisotropic compliant conductive interposer material is a product named MT that is available from Shin-Etsu Polymer. The particular anisotropic compliant conductive interposer 214 has a plurality of angled conductors 352. The angled conductors 352 conduct current only in the direction of the conductors. The angled conductors 352 provide for reliable compression without conductor fatigue. The conductors 352 are in a high density matrix such that several conductors can be electrically contacted when a contact element 208 contacts the interposer 214. The elastomeric material is actually a silicone base that provides high compliance over a wide temperature range. It should be noted that when angled conductors 352 are used in the anisotropic compliant conductive interposer 214, the pads 322 which correspond to the contact elements 208 are offset from being directly aligned with the contact element 208.

The guide plate 108 includes a bevel for coarse alignment. In the ball grid array and chip scale electronics packages, the self centering action of the balls contacting the contact elements 208 provides the fine or precise alignment. In the case of a land grid array, the bevels on the guide plate provide both the coarse and precision alignment between the lands of the land grid array and the contact elements 208.

Operation

In operation, an electrical path is formed between a particular input/output element 203 and a pad 322 on the user interface board 320 in response to the electrical component or device 202 being received in the site 200 of the guide plate 108. As the device or electrical component 202 enters the site 200, the input/output elements 203 contact the ends 300 of the contact elements 208. The ends 300 have a concave shape and self center the input/output elements 202. As the input/output elements 208 are contacted further, the end 310 of the contact elements 208 contact the anisotropic compliant conductive interposer 214. Conductors 352 within the interposer 214 conduct electrical signals down to the pads 322 on the interface board 320. The pads 322 are offset from a direct vertical alignment with the contact elements since the conductors 352 in the interposer 214 are angled. It should also be noted that in some applications it is desirable to place more than one pad 322 on the interface board 320 into electrical contact with the input/output element 203 of the device 202. The conductors 352 are spaced at a small enough pitch to allow two distinct electrical paths to a single input/output element 203.

Advantageously, the path length of the contact elements and the electrical path is minimized in this contactor. With a minimum electrical path length, the electrical environment for the contactor is optimized. The short path length provides minimized reactive impedance and minimized uncontrolled impedance in the electrical path between the electrical component 202 and the test electronics 112. In addition, the contact element construction and composition enhances the electrical environment. The contact elements 203 are relatively substantial and provide low path impedance. The construction and composition also provides a high number of contact cycles without failure. The contact elements in the openings also maximize the life of the anisotropic conductive interposer 214. The site 200 of the guide plate 108 has openings therein which are occupied by the contact elements 203. The guide plate and contact elements isolate the anisotropic conductive interposer 214 from the device or electrical component 202 which would contaminate the interposer. In addition, the end 310 of contact elements are designed to place minimal wear on the interposer 214.

Kelvin Connections

One of the instances where it may be desired to have two electrical paths to a single input/output element 203 is for making a kelvin connection. A kelvin connection is basically a high-impedance connection that is used to measure voltage at a particular point in an electrical path. One approach for making a kelvin connection has been shown in FIG. 3. In FIG. 3, a single contact element 208 forms an electrical path to the force-trace pad 330 and the sense-trace pad 332. The end 310 makes an electrical path to both the pad 330 and the pad 332. The sense-trace pad 332 is connected to a high-impedance line input into the test electronics 112. The force-trace pad 330 carries a signal or signals to and from the electrical component 202. Thus, there are two electrical paths formed through the conductive interposer material 214. The voltage can be accurately measured through the high-impedance path attached to the sense trace 232. This is one way to accomplish a kelvin connection to an input/output element 203 of a device 202. At this point it should be noted that in it is not uncommon to have a kelvin connection for many or even all of the input/output elements 203 on the grid array package.

Different Contact Elements

The contact elements 208 can be varied to provide for electrical contact with a variety of different input/output elements 203 of the electrical component 202. Different contact elements are used for different applications or test situations. FIGS. 4, 5, 6, 7 and 8 show different types of contact elements. In each of these FIGS. there are common elements which need not be described each time. Each figure includes a guide plate 108 showing one of the openings 206 therein in which the contact element 208 rides. The anisotropic compliant conductive interposer 214 is situated below the contact element 208. A pad 322 is situated below the anisotropic compliant conductive interposer 214. The contact elements vary in FIGS. 4–8. More specifically are the ends 300 and 310 of the contact elements 208 vary.

Figure 4:
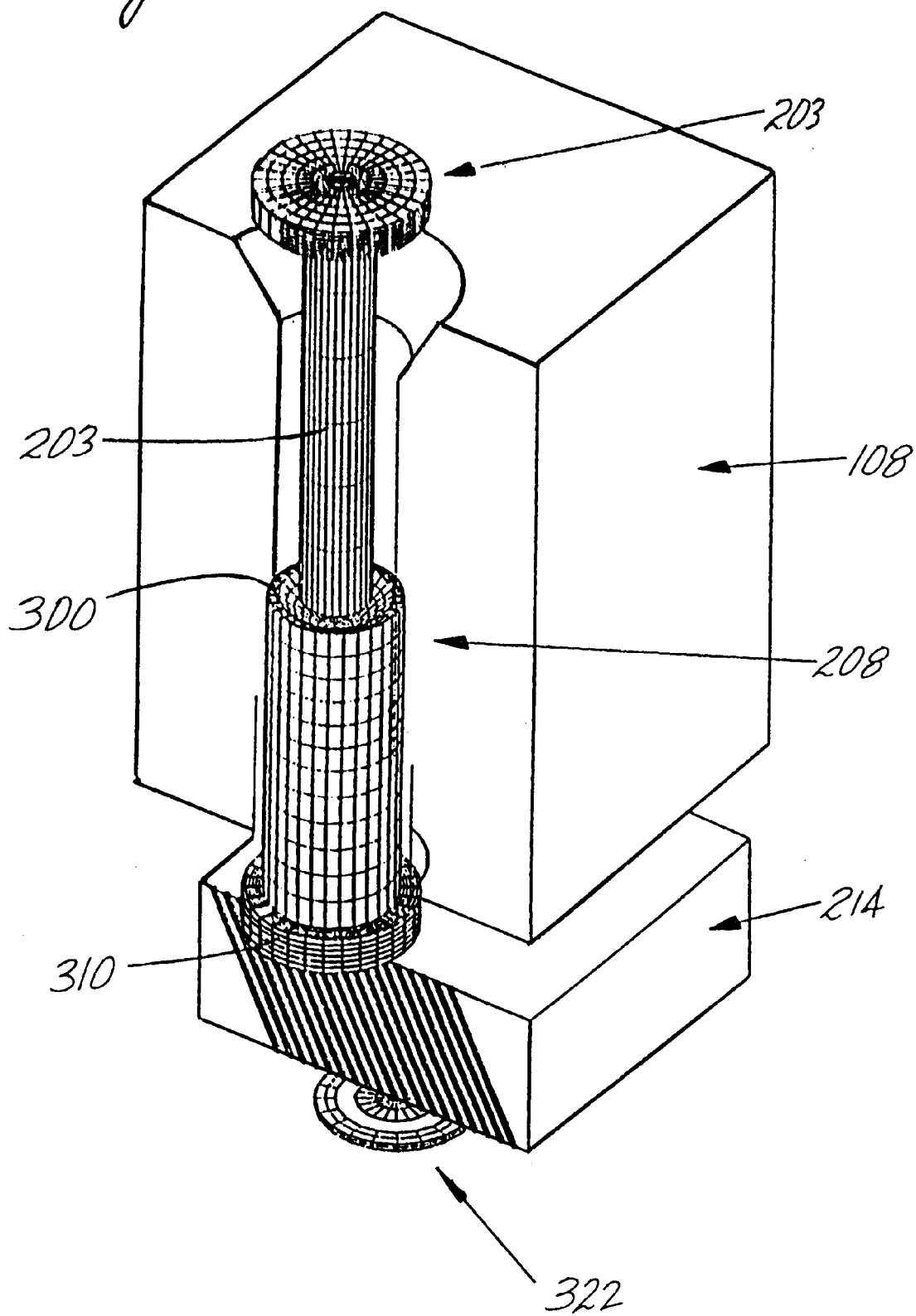
FIG. 4 is a perspective view of a contact element in contact with an input/output element.
Figure 5:
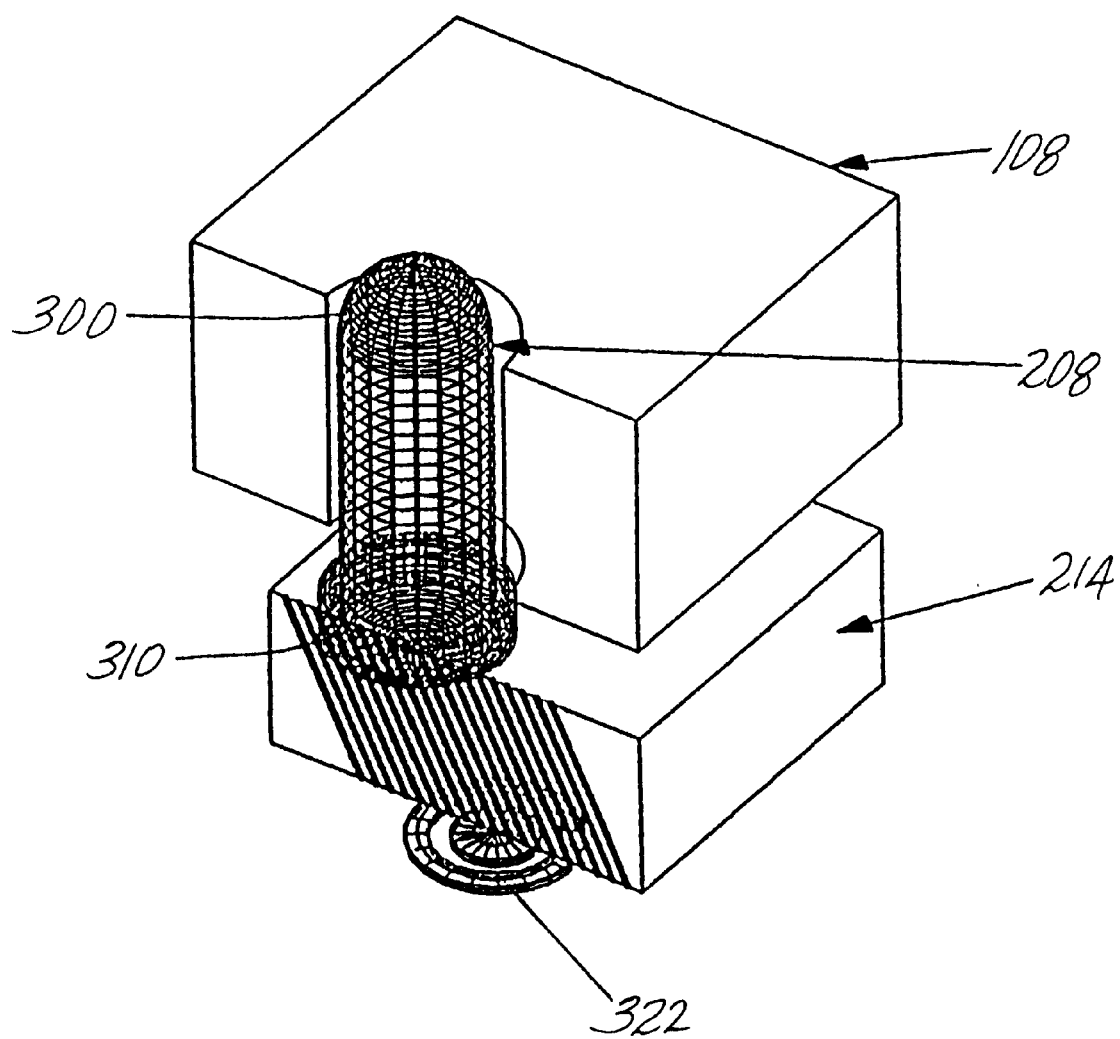
FIG. 5 is a cutaway perspective view of another contact element.

FIG. 4 shows an input/output element 203 in contact with contact element 208. The input/output element 203 is a pin from a pin grid array electrical component package. Contact element 208 is shown within the opening 206 in guide plate 108. End 300, which contacts the input/output element 203, has a conical depression. The pin grid array type input/output element 203 fits within the depression in the end 300 of the contact element 208. End 310, which contacts the anisotropic compliant conductive interposer 214, has a hemispherical shape. Each of the contact elements 208 described in FIGS. 4–9 has a hemispherical end 310 for contacting the anisotropic compliant conductive interposer 214. The size or radius of the end is varied depending on the application. The size or radius is varied so that different numbers of individual conducts 352 in anisotropic compliant conductive interposer 214 will form the electrical signal carrying path. The cylinder on end 310 is larger in diameter than the opening 206 in the guide plate 108. A pad 322 of the user interface board (shown in FIG. 3) is positioned below the anisotropic compliant conductive interposer 214. FIG. 5 shows a similar contact element 208. In this instance, the end 300 which contacts the electrical device 202 has a hemispherical shape. The guide plate 108 is also thinner than the guide plate shown in FIG. 4. This type of arrangement is used to contact electrical devices that have input/output elements 203 which are lands on the electrical device. The lands are pads which may or may not be raised and are positioned in an array on one surface of the electronic component or chip device 202. The hemispherical end as shown in FIG. 5 provides electrical contact with the lands on the electronic component 202.

Figure 6:
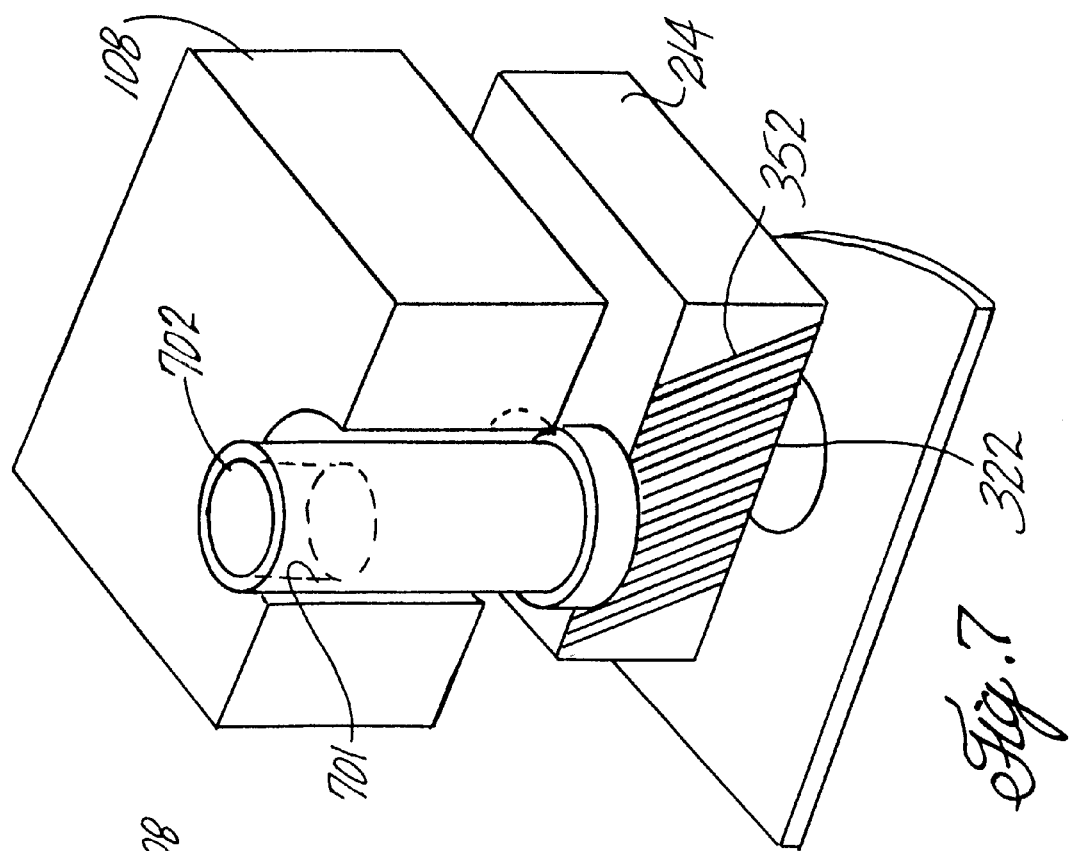
FIG. 6 is a cutaway perspective view of another contact element.

In FIG. 6, contact element 208 has a conical end 300 for contacting the input/output elements 203 of the electronic component 202. The contactor described herein is not restricted to use in grid array type packages. The contact element shown in FIG. 6 can be used to contact leads on a peripherally leaded electronic package. The contact element of FIG. 6 is a conically shaped element. A needle-shaped end 300 could also be employed. These smaller tipped contact elements are used to contact smaller surfaces or may be used to penetrate an oxidation or contamination layer which may be on the lead.

Figure 7:
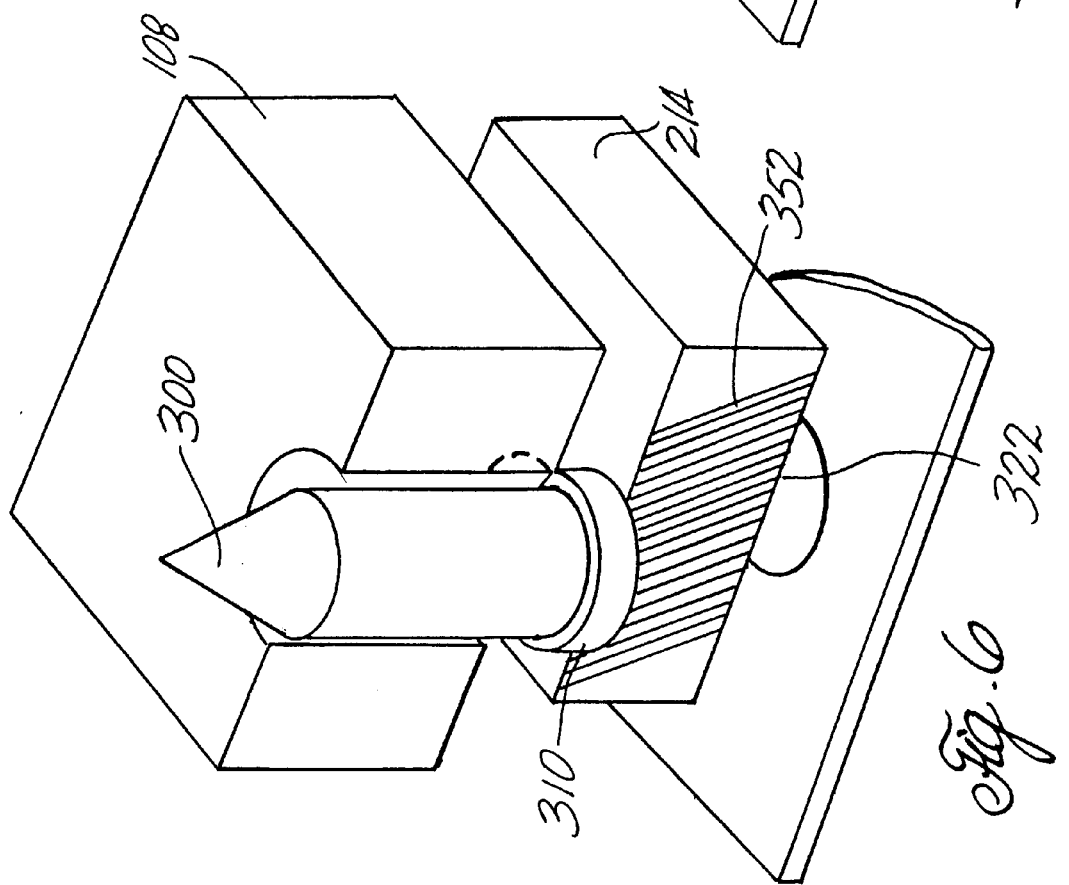
FIG. 7 is a cutaway perspective view of another contact element.

Several other types of ends are shown in FIGS. 7 and 8. FIG. 7 shows another contact element 208. The end of the contact element 208 shown in FIG. 7 has a bore 701. The bore 701 in the end 300 produces an edge 702 which provides good edge contact for some of the input/output elements 203 of the electrical component 202. This is typically used to contact balls of a ball grid array package. The edge penetrates oxidation or contamination layers. This end is also resistant to contamination on the edge contact surface. FIG. 8 shows another contact element 203. The end 300 in FIG. 8 includes multiple prongs 802. As shown, there are six prongs 802 on the end 300 which are used to contact the input/output elements 203 of the electrical component under test 202. The other end 310 is rounded so that it can contact the anisotropic compliant conductive interposer 214 without excessive wear to the interposer. It should be noted that the type of end 300 and 310 used on each contact element 203 can be mixed and/or matched depending upon the application for which the contact element is to be used. Different ends, for example, may be better for contacting different types of input/output elements 203. It is also contemplated that the ends 300 and 310 shown are not exhaustive and that other designs of ends 300 and 310 for contact elements 208 are also contemplated and included in this invention. There are several reasons for selecting different types of ends. For example, one type of end may provide an edge contact and other types of ends may provide point contacts. Some ends may be easier to maintain cleanliness and other ends 300 may be used to penetrate oxidation layers or contamination that may occur on input/output elements 203.

Another way to improve electrical contacts is to make the openings 206 inside the guide plate 208 angled with respect to the surface 204 of the site 200 for receiving the electrical device. This is shown in FIG. 9. In the previous figures, the angle of an axis of the opening 206 is perpendicular to the surface 204. In this particular instance, the angle has been modified slightly so that it is non-perpendicular to the surface 204. This provides an advantage in that the end 300 of the contact element 208 which contacts the input/output element 203 scrubs the input/output element 203 as it comes into contact with it. In other words, when the contact element 208 travels at an angle, the end 300 passes across the input/output element and scrubs through an oxidation and/or contamination layer that may have been formed on the input/output element 203.

Incorporation of External Circuitry

FIG. 10 shows an apparatus where external circuitry is added as part of the contactor. The external circuitry is sandwiched between the tester interface board 320 and the contactor 110 when making a series connection with the user interface board 320. An anisotropic compliant conductive interposer 214 on a frame 212 (shown in FIG. 2) abuts the contactor 110. Added to the sandwich, however, is a circuitry housing 1000, a second anisotropic compliant conductive interposer 1010, a third anisotropic compliant conductive interposer 1014 on a frame 1012 and an external circuit module interface 1020. The third anisotropic compliant conductive interposer 1014 in frame 1012, the circuitry housing 1000, the second anisotropic compliant conductive interposer 1010, and the external circuitry module interface 1020 form an external circuitry module 1050. The contactor 110 is essentially the same as previously described. It fits atop the external circuitry module interface 1020. External circuitry module interface 1020 is a printed circuit board that includes pads 1022 on the surface abutting the contactor that are arranged in an array that corresponds to the array of the contactor and accordingly, the device or electrical component 202 under test. The external circuitry module interposer 1020 has pads on the bottom surface arranged so that they provide an electrical path to the desired pads or components in the circuitry housing 1000. The external circuitry interface provides an electrical path from the pads 1022 arranged in an array on the surface abutting the contactor 110 to the components with the circuitry housing 1000. The external circuitry module also provides a flat surface to which the contactor can interact. The circuitry housing 1000 includes external circuitry within the frame of the circuitry housing. The external circuitry includes discrete circuit components arranged in such a way that the pads on the bottom of the external circuitry interface 1020 contact the discrete components through the second anisotropic compliant conductive interposer 1010.

It should be noted that the pads on the bottom of the external circuitry interface can be soldered directly to the discrete components within the circuitry housing 1000. Of course, the anisotropic compliant conductive interposer would be eliminated in the direct solder contact approach. Once hardwired, the user loses the opportunity to reconfigure the external circuitry module interface 1020 with respect to the circuitry housing 1000. The anisotropic conductive compliant interposer provides flexibility that allows a user to reconfigure the system. The second anisotropic compliant conductive interposer 1010, like the other interposer, provides an electric path between the pads 1022 of the external circuitry module interface 1020 and corresponding discrete components in the circuitry housing 1000. Similarly, the bottom surface of the housing also has pads or contacts to discrete electrical components. The third anisotropic compliant conductive interposer 1014 connects the pads or contacts of the circuitry housing 1000 to the pads of the tester interface board 320. The tester interface board is connected to the automated test equipment or test electronics 112. The circuitry housing 1000 contains circuits for any desired testing condition.

Also shown in FIG. 10 is a parallel connection between the tester interface board 320, the contactor 110, and a second circuitry housing 1060. Again, an anisotropic compliant conductive interposer 1070 within a frame 1072 is used to provide a compliant, conductive path between the circuitry housing 1060 and the tester interface board 320. To make a parallel connection to the tester interface board 320, pads (not shown) must be placed on the lower or opposite surface of the tester interface board 320. The pads on the bottom of the tester interface board 320 correspond to the pads on the circuitry housing 1060 so that upon assembly, the anisotropic compliant conductive interposer 1070 provides a compliant surface with a plurality of paths to the pads on the tester interface. It should be understood that one can choose to make any sort of parallel connection between the device under test 202 and the circuitry in circuitry housing 1060 and the interface board 320 without having to make a serial connection. Also it should be understood that one can make a serial connection between the electrical component or device 202 under test and the circuitry housing 1000 and the tester interface board 320 without having a parallel connection. The types of circuitry and the type of connection can be varied without departing from the scope of this invention.

Manual Actuator to Support Hand Testing

Manual testing is also needed for testing without an automated test handler of devices or electrical components 202. Manual actuators are used to support such manual testing. In a manual test environment, devices are placed in a contactor by hand or by using a vacuum pickup wand. There is no nest involved and, therefore, the contactor 110 must directly align to the device or electrical component 202. A manual actuator 1100 applies the necessary compression force for contact between the device under test 202 and the contactor 110. The actuator 1100 is designed to properly support the package so that no damage occurs while undergoing compression. The manual actuator 1100 includes a contactor 110, a frame 1120, a lid 1130, a clip 1135 and an actuator lever 1140. The lid 1130 is attached to the frame by a hinge 1122. FIG. 11 shows the manual tester in a closed position.

A manual actuator is shown in FIG. 11. The manual actuator is used when the cost of automated test handling device is prohibitive or in cases where there are not many electrical components tested at a particular factory. The contactor 110 is the same as has been described above. A frame 1120 is attached to the contactor 110. A lid 1130 is attached to the frame with a hinge 1122. A clip 1135 holds the lid 1130 closed with respect to the frame 1120. Attached to the top of the lid 1130 is an actuator mechanism which includes an axle 1142, a cam 1144 and an actuator lever 1140. The cam 1144 and the actuator lever 1140 are attached to the axle 1142. A pair of pivots capture two portions of the axle 1142. The cam 1144 contacts an actuation pin 1150.

Figure 12:
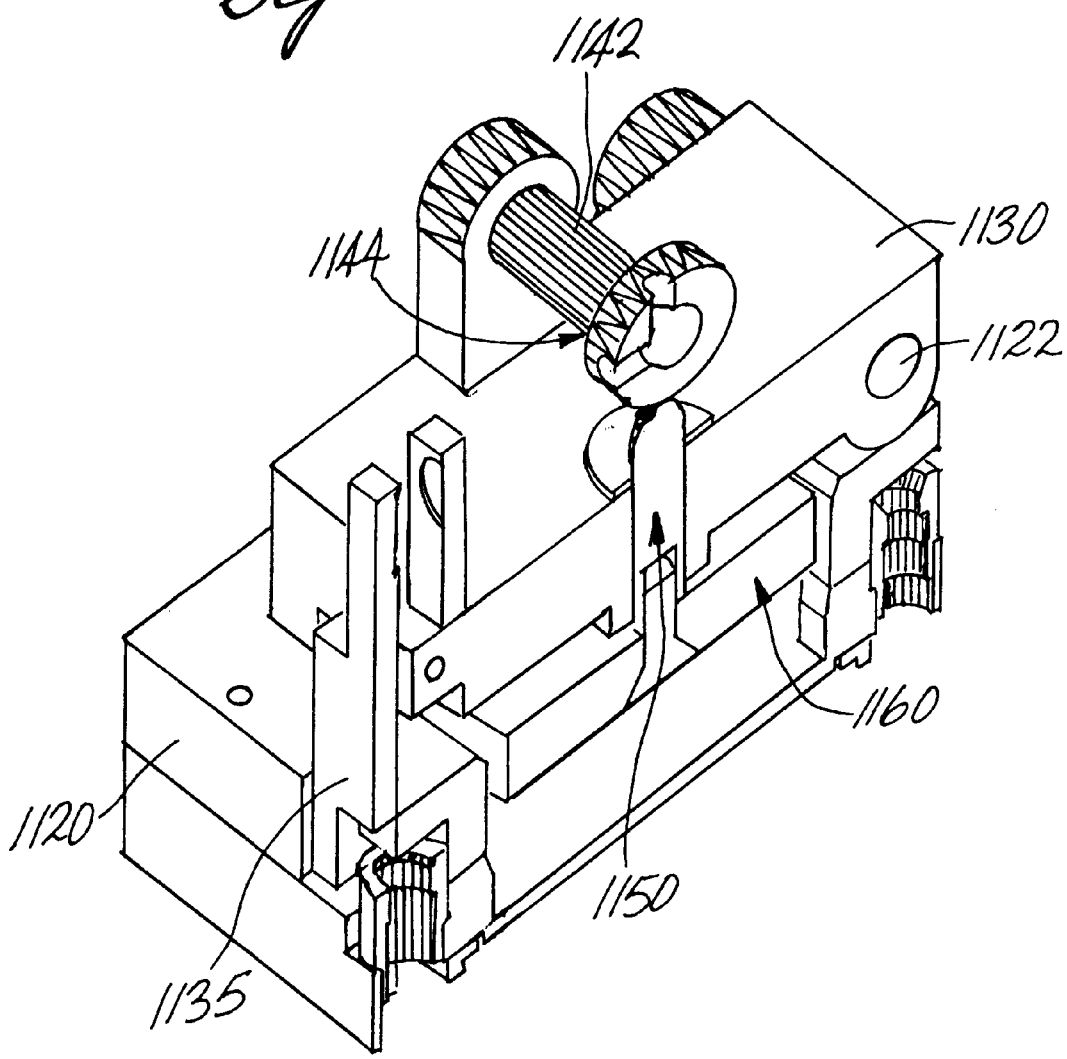
FIG. 12 is a perspective view of a manual contactor in an open position.

FIG. 12 shows a cross-sectional perspective view of the manual actuator. In FIG. 12, the cam 1144 is in contact with the actuator pin 1150. The cam 1144 is elliptically shaped such that when rotated by the actuator lever 1140, it produces a downward force on the actuator pin 1150. The actuator pin 1150 is attached to a supportive compressive plate 1160. The supportive compressive plate 1160 distributes the force placed on the actuator pin over the surface of the supportive compressive plate 1160. In operation, the supportive compressive plate 1160 contacts the device 202 under test and places a proper compressive force on the device under test or electrical component 202. In the manual testing environment, the guide ways of the guide plate have to provide precise alignment for the device under test 202. Of course, precise alignment is needed for a land grid array type electronic package. If the electronic package being tested is a ball grid array type package, the input/output elements 203 will serve to precisely align the ball grid array with the contact elements. The rest of the contactor is exactly the same as described above. The manual actuator allows for flexibility in terms of cost and in terms of testing low numbers of electrical components and provides the same advantages, namely, freedom from many of the undesirable electrical conditions produced by long electrical contacts or long leads in a contactor.

Figure 13:
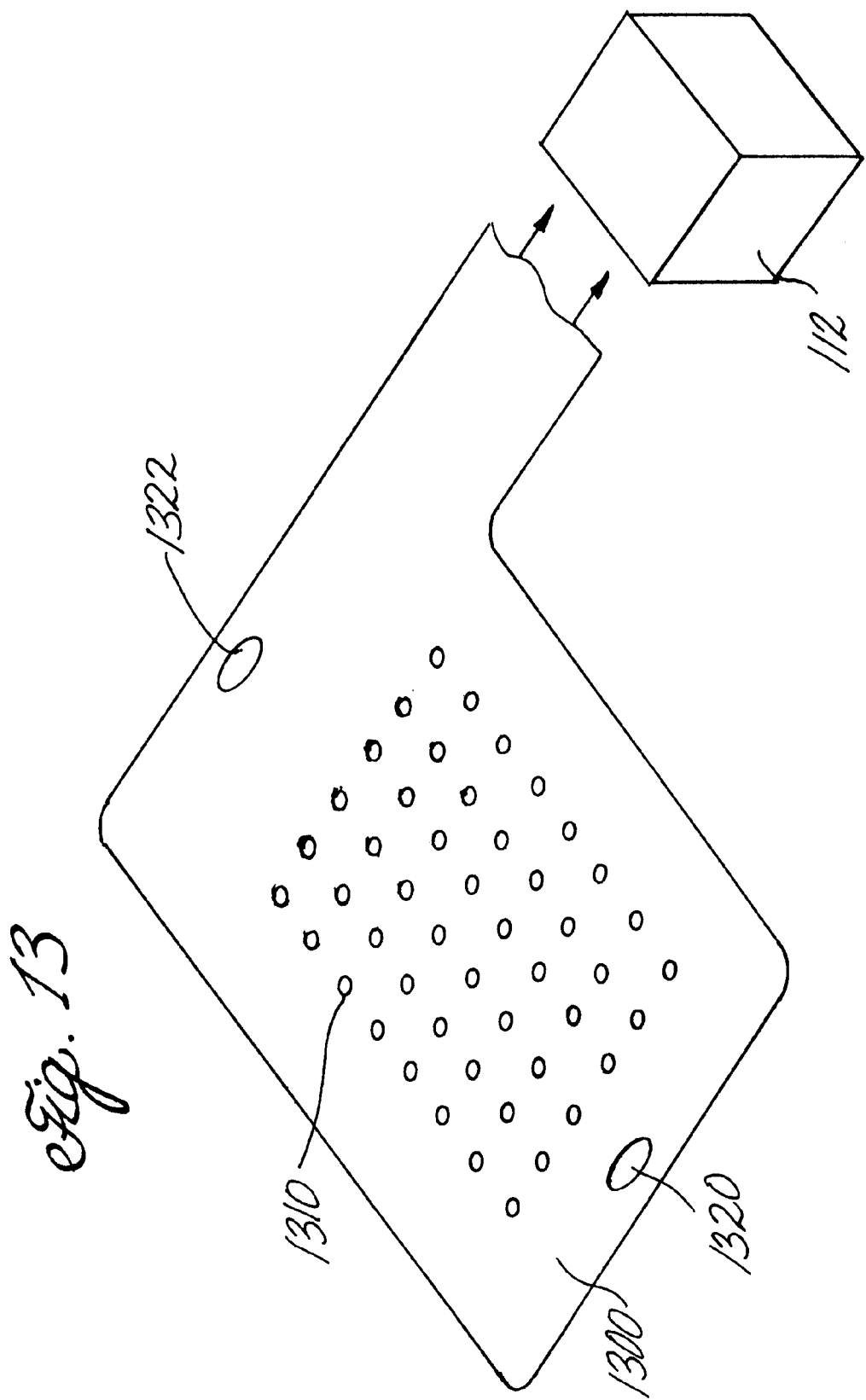
FIG. 13 is a perspective view of a non conductive film array.

Various components of the testing apparatus can be changed. FIG. 13 shows another embodiment of the testing apparatus that substitutes an array of raised sculpted contacts 1310 on a non conductive film array 1300 such as a sheet of polyimide. The array of individual raised sculpted contacts are formed using etching steps to remove metal plated onto the nonconductive film array 1300 and additive or plating steps add more metal to the pad sites. The result is an array of raised sculpted contacts on the polyimide sheet. A first alignment opening 1320 and a second alignment opening 1322 are also placed onto the polyimide sheet using the etching process. Advantageously, the precision associated with etching is used to locate the array with respect to the alignment openings. Dowels can then be placed into the alignment openings and into the guide plate and interface board to precisely align the raised sculpted contacts with respect to the input/output elements on the electrical device under test 202 and other portions of the contactor 101. A plurality of conductors, represented by a pair of arrows, carries electrical signals to and from test electronics 112

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A contactor apparatus comprising:
  a contactor guide plate for receiving an electrical device having a plurality of input/output elements formed in an array on a surface of the electric device, said guide plate having a plurality of opening therein, said contactor guide plate further comprising:
  a first major surface;
  a second major surface;
  guide ways for coarse positioning of said electrical device, the guide ways positioned between the first major surface and the second major surface; and a plurality of contact elements which fit within the openings of the guide plate, each of the contact elements having a first end and a second end, the contact elements longer than the length of the guide ways positioned between the first and second major surfaces of the guide plate, the first end of each of the plurality of contacts contacting the input/output elements of the electrical device package, each of the contact elements including a stop ring for retaining the contact element with respect to the guide plate; and a complaint conductive interposer attached to a frame positioned adjacent the guide plate to prevent the guide plate from compressing the complaint conductive interposer, said conductive interposer including a multiplicity of electrical conductors, a plurality of which make electrical contact with the contact elements, each of the multiplicity of electrical conductors being transverse to a line perpendicular to the guide plate.

2. The contactor apparatus of claim 1 wherein the one of said first and second major surfaces is adjacent the frame, wherein the plurality of openings within the guide plate are substantially perpendicular to the one of said first and second major surfaces adjacent the frame.

3. The contactor apparatus of claim 1 wherein the one of said first and second major surfaces is adjacent the frame, wherein the plurality of openings within the guide plate are at a non-perpendicular angle with respect to the one of said first and second major surfaces adjacent the frame.

4. The contactor guide plate for receiving an electrical device having a plurality of input/output elements formed in an array on a surface of the electrical device package as described in claim 1, further comprising:

a frame abutting the guide plate; and an anisotropic complaint conductive sheet positioned within said frame, said frame and anisotropic sheet positioned near the end of the contact elements opposite the end that contacts the input/output elements of the electrical device package.

5. The contactor apparatus of claim 1 wherein the conductive interposer is comprised of silicone based elastomer material.

6. The contactor apparatus of claim 1 wherein the second end of each contact element is hemispherical to prevent premature wear of the compliant conductive interposer.

7. The contactor apparatus of claim 1 wherein the contactor elements further comprises a printed circuit having a plurality of pads in contact with the complaint conductive interposer.

8. The contactor apparatus of claim 1 wherein the stop rings are located near the second end of the contact element.

9. The contactor apparatus of claim 1 wherein the stop rings are located near the second end of the contact element, between the guideplate and the complaint conductive interposer.

10. A contactor apparatus for receiving an electrical device having a plurality of input/output elements formed in an array on a surface of the electrical device, said contactor comprising:

a guide plate including a plurality of contact elements having a first end and a second end, said contact elements positioned in an array so that the first end of said contact elements contact the input/output elements of said electrical device, said contact elements having a length greater than the thickness of the guide plate; and a conductive interposer attached to a frame, said frame positioned adjacent the guide plate and near the contact elements of the guide plate, said conductive interposer having conductors therein which are nonperpendicular with respect to the guide plate, the conductors carry signals to and from the second end of the contact elements in response to the input/output elements contacting the first end of said contact elements while said frame prevents the guide plate from compressing the conductive interposer.

11. The contactor apparatus of claim 10 wherein the contact elements of the guide plate are cylindrically shaped.

12. The contactor apparatus of claim 10 wherein the first end of the contact elements has a concave shape.

13. The contactor apparatus of claim 10 wherein the second end of the contact elements has a convex shape.

14. The contactor apparatus claim 10 wherein the first end of the contact elements has a bore therein.

15. The contactor apparatus of claim 10 further comprising a plurality of electrical testing components electrically connected to the conductive interposer.

16. The contactor apparatus of claim 15 further comprising a circuit housing, said electrical testing components positioned within the housing.

17. The contactor apparatus of claim 16 further comprising an electrical interface positioned between the electrical testing components within the housing and the conductive interposer.

18. The contactor apparatus of claim 10 wherein each contact element includes a feature to retain the contact element with respect to the contactor apparatus.

19. The contactor apparatus of claim 10 wherein each contact element includes a feature to retain the contact element with respect to the contactor apparatus located near the second end of the contact element, the feature positioned between the guideplate and the complaint conductive interposer.

* * * * *

UNITED STATES PATENT AND TRADEMARK OFFICE
CERTIFICATE OF CORRECTION

PATENT NO.  : 6,181,149 B1
DATED       : January 30, 2001
INVENTOR(S) : Mark K. Godfrey, Jessie G. Crane and Paul Zadworniak It is certified that error appears in the above-identified patent and that said Letters Patent is hereby corrected as shown below:

Column 2,
Line 23, replace "input output/elements" with -- input/output elements --.

Column 3,
Line 28, replace "a exploded" with -- an exploded --.
Line 51, replace "non conductive" with -- nonconductive --.

Column 4,
Line 66, after "designed" insert -- to --.

Column 5,
Line 8, replace "self centering" with -- self-centering --.
Line 16, after "board 320" delete "which".
Line 20, after "this," delete "at".
Line 54, replace "self centering" with -- self-centering --.
Line 67, replace "self center" with -- self-center --.

Column 6,
Line 53, after "that" delete "in".

Column 7,
Line 2, replace "More specifically are" with -- More specifically, --.

Column 10,
Line 32, replace "non conductive" with -- nonconductive --.
Line 48, after "electronics 112" insert a period.
Line 61, replace "opening" with -- openings --.

Column 11,
Lines 11 and 13, replace "complaint" with -- compliant -- (both occurrences).
Lines 28-37, delete claim 4 in its entirety and insert therefor
-- 4. The contactor apparatus of claim 1 wherein the contactor guide
plate has a recess therein, said recess sized to receive the frame to
which the compliant conductive sheet is attached. --.
Line 46, replace "complaint" with -- compliant --.
Line 52, replace "complaint" with -- compliant --.

UNITED STATES PATENT AND TRADEMARK OFFICE
CERTIFICATE OF CORRECTION

PATENT NO. : 6,181,149 B1
DATED : January 30, 2001
INVENTOR(S) : Mark K. Godfrey, Jessie G. Crane and Paul Zadworniak It is certified that error appears in the above-identified patent and that said Letters Patent is hereby corrected as shown below:

Column 12,
Line 30, after "apparatus" insert -- of --.
Line 50, replace "complaint" with -- compliant --.

Signed and Sealed this

Seventeenth Day of December, 2002

JAMES E. ROGAN
*Director of the United States Patent and Trademark Office*